United States Patent
Schrodinger

(10) Patent No.: US 7,095,254 B2
(45) Date of Patent: Aug. 22, 2006

(54) METHOD FOR PRODUCING A CONTROL SIGNAL WHICH INDICATES A FREQUENCY ERROR

(75) Inventor: Karl Schrodinger, Berlin (DE)

(73) Assignee: Infineon Techologies AG, Munich (DE)

( * ) Notice: Subject to any disclaimer, the term of this patent is extended or adjusted under 35 U.S.C. 154(b) by 0 days.

(21) Appl. No.: 10/836,633

(22) Filed: Apr. 29, 2004

(65) Prior Publication Data

US 2004/0263224 A1 Dec. 30, 2004

(30) Foreign Application Priority Data

Apr. 29, 2003 (DE) ................................ 103 19 899

(51) Int. Cl.
*H03D 13/00* (2006.01)
(52) U.S. Cl. ........................... 327/40; 327/48; 327/151
(58) Field of Classification Search ................. 327/39, 327/40, 42–44, 45, 47–49, 141, 151, 144–147, 327/154–156, 160, 162; 377/39, 50, 51
See application file for complete search history.

(56) References Cited

U.S. PATENT DOCUMENTS

| | | | | |
|---|---|---|---|---|
| 3,723,889 A | * | 3/1973 | Oberst | 327/10 |
| 3,924,183 A | * | 12/1975 | Fletcher et al. | 324/76.48 |
| 4,360,782 A | * | 11/1982 | Nowell | 327/48 |
| 4,783,622 A | | 11/1988 | Honjo et al. | 324/76.61 |
| 5,180,935 A | * | 1/1993 | Abdi et al. | 327/42 |
| 5,410,572 A | * | 4/1995 | Yoshida | 375/376 |
| 5,736,872 A | * | 4/1998 | Sharma et al. | 327/3 |
| 6,094,078 A | * | 7/2000 | Suzuki | 327/156 |
| 6,229,864 B1 | * | 5/2001 | DuFour | 375/375 |
| 6,342,818 B1 | * | 1/2002 | Segawa et al. | 331/14 |
| 6,392,495 B1 | * | 5/2002 | Larsson | 331/11 |
| 6,407,642 B1 | * | 6/2002 | Dosho et al. | 331/11 |
| 6,542,040 B1 | * | 4/2003 | Lesea | 331/11 |
| 6,560,305 B1 | * | 5/2003 | Croughwell | 375/376 |
| 6,563,346 B1 | * | 5/2003 | Abbiate et al. | 327/48 |
| 6,590,427 B1 | * | 7/2003 | Murray et al. | 327/12 |
| 6,621,354 B1 | * | 9/2003 | Kornblum et al. | 331/14 |
| 6,642,747 B1 | * | 11/2003 | Chiu | 327/40 |
| 6,807,225 B1 | * | 10/2004 | Tonietto et al. | 375/219 |
| 6,834,093 B1 | * | 12/2004 | Chiu | 377/39 |

FOREIGN PATENT DOCUMENTS

EP 1 006 662 A2 6/2000

OTHER PUBLICATIONS

Schrufer: "Elektrische Messtechnik", 1983, Munchen, Carl Hanser Verlag Munchen Wien, pp. 318-321.
In "Radio Mento Elektronik", "Frequenz-Comparator Mit Zwei Schwellen", 1980, Jahrgang 46, Nr. 4, pp. 94-95.

* cited by examiner

*Primary Examiner*—Timothy P. Callahan
*Assistant Examiner*—Hai L. Nguyen
(74) *Attorney, Agent, or Firm*—Eschweiler & Associates, LLC

(57) ABSTRACT

A method which provides a very simple way of forming a control signal if the frequencies differ too greatly from one another between a useful signal and a reference signal. A control signal is produced which indicates that the frequency error between the frequencies of a useful signal and the frequency of a reference signal exceeds a prescribed error limit value, where the useful signal and the reference signal are used to produce a pulsed signal whose pulse length is proportional to the frequency difference between the useful signal and the reference signal. The pulse length is then compared with a prescribed maximum pulse length, and the control signal is produced if the pulse length exceeds the prescribed maximum pulse length.

19 Claims, 3 Drawing Sheets

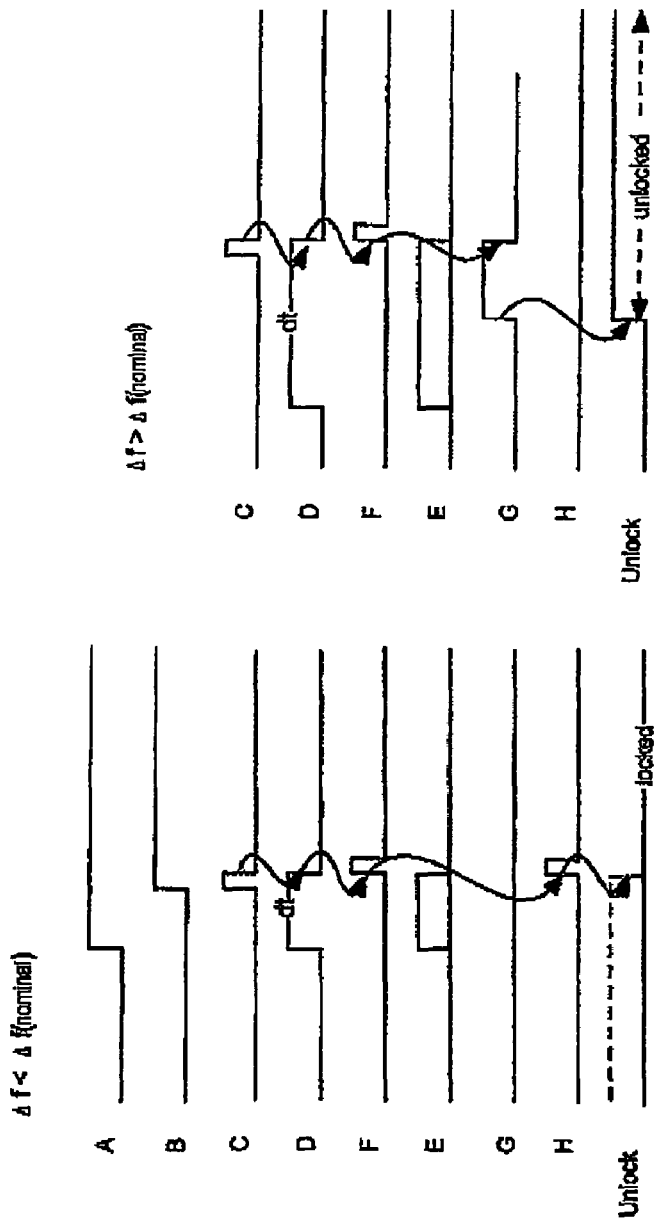

METHOD FOR PRODUCING A CONTROL SIGNAL WHICH INDICATES A FREQUENCY ERROR

FIELD OF THE INVENTION

The present invention is directed to electronic circuits, and in particular to electronic circuits that generate or monitor signals in a predetermined frequency range.

SUMMARY OF THE INVENTION

The invention is directed to a method which can be used very easily to form a control signal which indicates that the frequency of a useful signal differs too greatly from the frequency of a reference signal.

Accordingly, the invention uses the useful signal and the reference signal first to produce a pulsed signal whose pulse length is proportional to the frequency difference between the useful signal and the reference signal. Next, the pulse length is compared with a prescribed maximum pulse length, and the control signal is produced if the pulse length exceeds a prescribed maximum pulse length.

A fundamental advantage of the inventive method can be seen in that it can be implemented very quickly and without any great complexity; this is because the invention merely involves the formation of a pulsed signal whose pulse length is proportional to the frequency difference between the signals which are to be monitored. This pulsed signal then merely needs to be monitored in respect of whether the pulse length exceeds a prescribed maximum pulse length.

The inventive method can be used, by way of example, to regulate or control a controllable oscillator; it is therefore regarded as advantageous if the useful signal used is the output signal from a controllable oscillator or an auxiliary signal formed using the output signal from the controllable oscillator.

It is a simple matter and hence advantageous to produce the pulsed signal using at least two counting devices. Preferably, this involves feeding the useful signal into a first counting device having a prescribed first maximum counter reading; the reference signal is fed into a second counting device having a second maximum counter reading which matches the first maximum counter reading. The counter overflow outputs of the two counting devices are monitored for a counter overflow, and the pulsed signal is produced whenever exclusively a single one of the two counting devices indicates a counter overflow.

The frequencies of the useful signal and the reference signal are advantageously monitored continuously; preferably, the monitoring operation or the method for producing the control signal is thus repeated after the counter readings on the two counting devices have been reset.

The pulse length of the pulsed signal can be compared with a prescribed maximum pulse length particularly easily and hence advantageously by feeding the useful signal or the reference signal into a control counting device while the pulsed signal is present, monitoring the counter reading on the control counting device, and producing the control signal if the counter reading on the control counting device exceeds a prescribed limit counter reading.

To allow continuous monitoring of the frequencies of the useful signal and the reference signal, it is regarded as advantageous if directly or at different times after the pulsed signal disappears (terminates) the counter reading on the control counting device is reset in order to be able to recheck whether the frequency error between the frequencies of the useful signal and the reference signal exceed the prescribed error limit value.

The prescribed limit counter reading on the control counting device is advantageously formed by the maximum counter reading on the control counting device; the counter reading on the control counting device is then preferably monitored using a counter overflow output on the control counting device. The control signal is produced if the counter overflow output of the control counting device indicates a counter overflow.

The control signal is preferably produced using a flip-flop whose Set input is connected to the counter overflow output of the control counting device. In this case, the flip-flop performs a kind of "storage function" with which the control signal is stored, so to speak.

The method for producing the control signal can preferably be used to actuate a data regeneration circuit. To this end, a control input on a controllable oscillator in the data regeneration circuit is supplied a reference voltage formed directly or indirectly using the reference signal and the output signal from the controllable oscillator when the control signal has been formed or is present; otherwise, the control input on the controllable oscillator is connected to a phase locked loop whose input side is connected to the controllable oscillator and which is supplied a data signal which is present on the data regeneration circuit.

The invention is also directed to a particularly simple frequency comparison device for producing a control signal which indicates that the frequency error between the frequencies of a useful signal and a reference signal exceeds a prescribed error limit value.

Accordingly, the invention provides a frequency comparison device having a pulsed generation device which uses a useful signal and a reference signal to produce a pulsed signal whose pulse length is proportional to the frequency difference between the useful signal and the reference signal. A pulse-length comparison device is used to compare the pulse length of the pulsed signal produced with a prescribed maximum pulse length, and the control signal is produced using the pulse-length comparison device if the pulse length exceeds a prescribed maximum pulse length.

BRIEF DESCRIPTION OF THE DRAWINGS

FIGS. 3A and 3B show the wave forms for signals which arise in the data regeneration circuit shown in FIG. 1 and in the frequency comparison device shown in FIG. 2.

DESCRIPTION OF A PREFERRED EXEMPLARY EMBODIMENT

Figure 1:
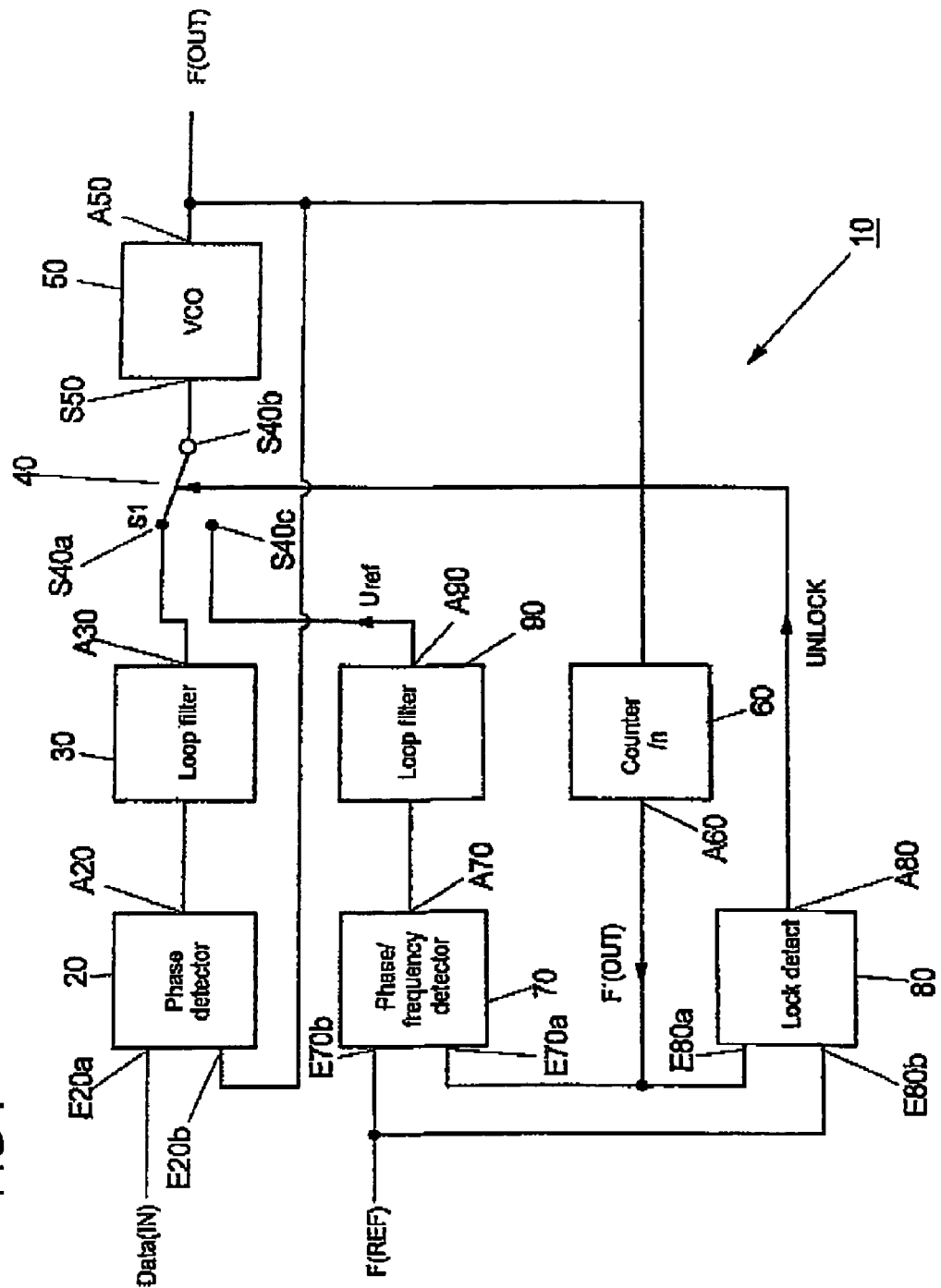
FIG. 1 shows an exemplary embodiment of a data regeneration circuit in which a frequency comparison device in line with the invention is used.

FIG. 1 shows a data regeneration circuit 10. The input side of this data regeneration circuit 10 has a phase detector 20 whose input E20a has a data signal Data(IN) applied to it. Connected downstream of the phase detector 20 at an output A20 is a loop filter 30 whose output A30 is connected to a switch connection S40a on a switch 40. A further switch connection S40b on the switch 40 is connected to a control input S50 on a controllable oscillator 50 whose output A50 produces a clock signal F(OUT). In this case, the clock signal F(OUT) has a clock frequency which corresponds or is intended to correspond to the clock frequency of the data signal Data (IN).

The output A50 of the controllable oscillator 50 is connected to a further input E20b on the phase detector 20 and to a counter 60 which reduces the clock frequency of the clock signal F(OUT) by the factor "n". The output A60 of the counter 60 is connected to an input E70a on a phase/frequency detector 70 and to an input E80a on a frequency comparison device or a "lock detect circuit" 80.

A further connection E70b on the phase/frequency detector 70 is supplied a reference signal F(REF) which has a prescribed reference frequency fref. The reference signal F(REF) is additionally also applied to a further input E80b on the frequency comparison device 80.

The output side of the phase/frequency detector 70 is connected by its output A70 to a loop filter 90 whose output A90 is connected to an additional switch connection S40c on the switch 40.

The function of the two loop filters 30 and 90 is to filter the pulses from the phase detector 20 or from the phase/frequency detector 70 and to produce, on the output side, an averaged DC voltage for actuating the controllable oscillator 50.

The data regeneration circuit 10 shown in FIG. 1 is operated as follows:

First, the switch 40 is actuated by the frequency comparison device 80 such that the switch 40 connects the additional switch connection S40c and the further switch connection S40b on the switch 40 to one another. In this switch position of the switch 40, the loop filter 90 is connected to the controllable oscillator 50, which means that the controllable oscillator 50 is controlled indirectly using the reference signal F(REF).

The phase/frequency detector 70 has the reference signal F(REF) and also the output signal F(OUT) from the oscillator 50—divided down by the factor "n" (F' (OUT))—applied to it. The phase/frequency detector 70 thus produces, at its output A70, a reference voltage U(REF) which passes through the loop filter 90 and arrives at the control input S50 on the oscillator 50. This reference voltage U(REF) is used to actuate the controllable oscillator 50 such that its output A50 outputs a clock signal F(OUT) whose clock frequency corresponds to n times the frequency of the reference signal F(REF).

The clock signal F(OUT) produced by the oscillator 50 at the output A50 also arrives at the frequency comparison device 80, which compares the clock signal F' (OUT)—again divided down by the factor "n"—with the reference signal F(REF). The frequency comparison device checks whether the frequency error between the frequency of the clock signal F(OUT) and the frequency of the reference signal F(REF) exceeds a prescribed error limit value. If this is the case, the frequency comparison device 80 produces an unlock signal with a logic "1" at its output A80. If there is a lgic "1" on the control connection S40 of the switch 40, then the switch 40 remains in the switching position described; this means that the further switch connection S40b and the additional switch connection S40c of the switch 40 remain connected to one another or are connected to one another.

If, by contrast, the frequency comparison device 80 establishes that the frequency error between the divided-down clock signal F' (OUT) and the reference signal F(REF) does not exceed or is below a prescribed error limit value, then the frequency comparison device 80 produces an unlock signal with a logic "0" at its output A80. If there is a logic "0" on the control connection S40 of the switch 40, then this switch is changed over such that one switch connection S40a is now connected to the further switch connection S40b of the switch 40. This isolates the controllable oscillator 50 from the phase/frequency detector 70 and the loop filter 90 and instead connects it to the phase detector 20 and the loop filter 30.

If the controllable oscillator 50 is connected to the phase detector 20, then it is actuated by the phase detector 20 such that its output A50 produces a clock signal F(OUT) whose frequency corresponds to the clock frequency of the data signal Data(IN). Hence, the oscillator 50 will thus lock onto the data frequency of the data signal Data(IN).

In summary, the data regeneration circuit 10 shown in FIG. 1 thus operates in two stages. In a first stage, the oscillator 50 is synchronized to the reference signal F(REF). As soon as synchronization is complete and this has been established using the frequency comparison device 80, the switch 40 is changed over using the frequency comparison device 80, whereupon the oscillator 50 is then subsequently synchronized to the frequency of the data signal Data(IN).

The function of the frequency comparison device 80 and of the phase/frequency detector 70 is thus to form a kind of "capture aid" which first pulls the phase locked loop formed by the data regeneration circuit 10 into the range of the "correct" frequency. As soon as this "capture operation" is complete, the controllable oscillator 50 can then be supplied the actual data signal Data(IN) so that it can lock onto the frequency of the data signal Data(IN).

Figure 2:
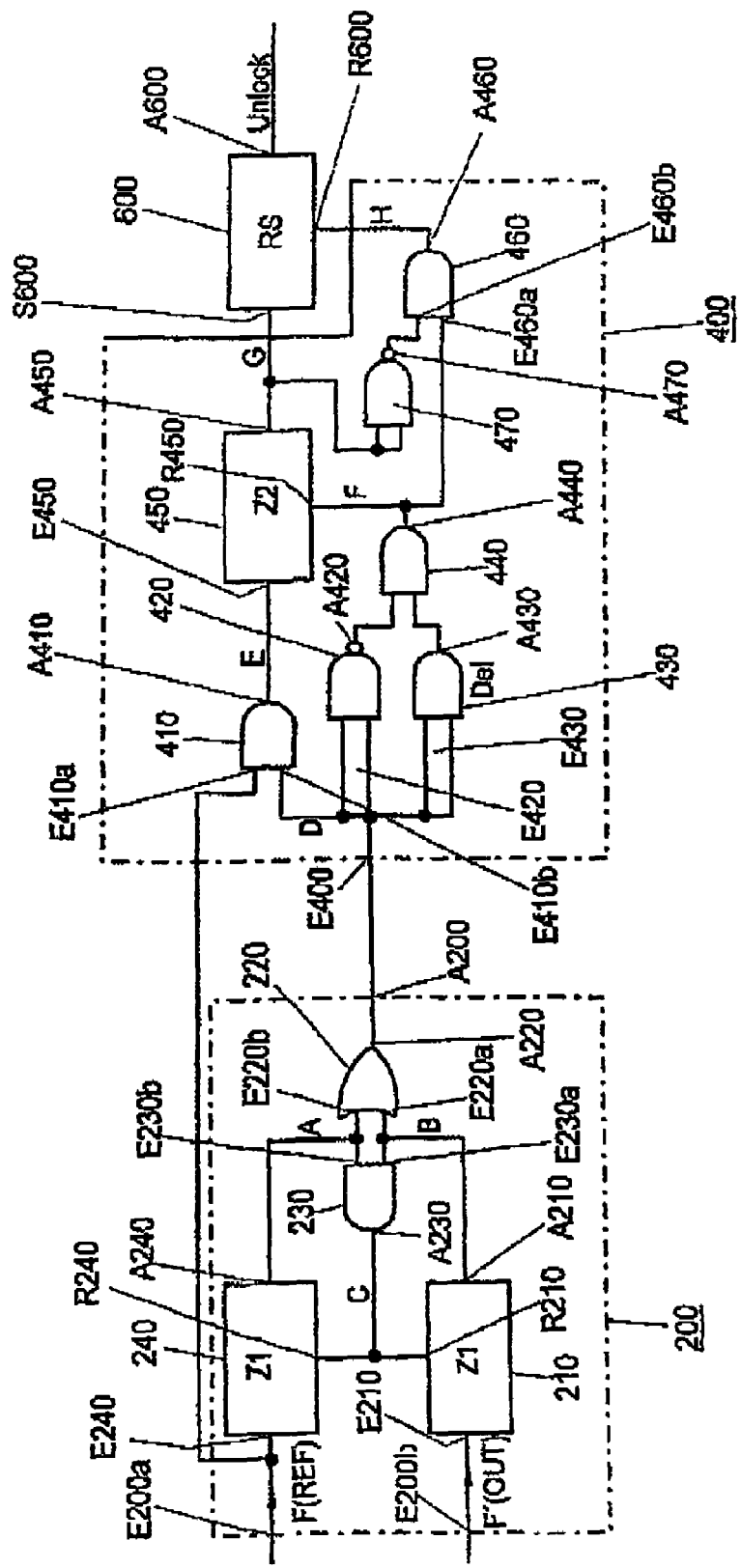
FIG. 2 shows the frequency comparison device shown in FIG. 1 in detail.

The way in which the frequency comparison device 80 shown in FIG. 1 works is shown in detail in FIG. 2. It will be seen that the frequency comparison device 80 has a pulse generation device 200, a control counting device 400 and an RS flip-flop 600.

At an input E200a on the pulse generation device 200, the reference signal F(REF) is fed into the frequency comparison device 80 or into the pulse generation device 200. The input E200a of the pulse generation device 200 thus corresponds to the further input E80b of the frequency comparison device 80 (cf. FIG. 1).

A further input E200b on the pulse generation device 200 has the clock signal F' (OUT) from the oscillator 50, divided down by the factor "n", applied to it. The further input E200b of the pulse generation device 200 thus corresponds to one input E80a on the frequency comparison device 80 (cf. FIG. 1).

The pulse generation device 200 has a first counting device 210, whose input E210 is connected to the further input E200b of the pulse generation device 200. A counter overflow output A210 on the first counting device 210 is connected to a counter overflow monitoring device 220 which is in the form of an OR gate, specifically to an input E220a on this device 220. In addition, the counter overflow output A210 of the first counting device 210 is connected to an input E230a on an AND gate 230.

One input E200a on the pulse generation device 200 has a second counting device 240 connected to it whose counter overflow output A240 is connected to a further input E220b on the counter overflow monitoring device 220 and to a further input E230b on the AND gate 230.

The output A230 of the AND gate 230 is connected to a Reset input R240 on the second counting device 240 and to a Reset input R210 on the first counting device 210.

An output A200 on the pulse generation device 200 is formed by an output A220 on the counter overflow monitoring device 220.

The output A220 of the counter overflow monitoring device 220 is connected to an input E400 on the control counting device 400. This input E400 of the control counting device 400 has an input E410 on an AND gate 410, the two inputs E420 of a NAND gate 420 operating as an inverter, and also the two inputs E430 of a delay element 430 connected to it.

The output A420 of the inverter 420 and also the output A430 of the delay element 430 are connected to inputs on an AND gate 440 whose output A440 is connected to a Reset input R450 on a counter 450. The output A440 of the AND gate 440 is also connected to an input E460a on an AND gate 460; a further input E460b on this AND gate 460 is connected to an output A470 on a NAND gate 470 operating as an inverter. The input side of the inverter 470 has an output A450 on the counter 450 connected upstream of it.

The input E450 of the counter 450 is connected to an output A410 on the AND gate 410, and the output A450 of said counter is connected to a Set input S600 on the RS flip-flop 600. A flip-flop output A600 on the flip-flop 600 produces the unlock signal for the frequency comparison device 80. Arranged upstream of a Reset input R600 on the RS flip-flop 600 is an output A460 on the AND gate 460.

The frequency comparison device 80 shown in FIG. 2 is operated as follows:

The divided-down clock signal F' (OUT) from the oscillator 50 and also the reference signal F(REF) are fed into the pulse generation device 200. In the process, the reference signal F(REF) arrives at the second counting device 240, which starts to count. The divided-down clock signal F(OUT) from the oscillator 50 arrives at the first counting device 210, whereupon the first counting device 210 starts to count.

The two counting devices 210 and 240 are identical and have the same "counter length" n1. This means that the two counting devices 210 and 240 can each count up to a maximum counter reading of $2^{n1}$. If the divided-down clock signal F' (OUT) and the reference signal F(REF) were to have identically the same frequency, then the two counter overflow outputs A210 and A240 of the two counting devices 210 and 240 would each produce the same signal image; this means that the counter overflow monitoring device formed by the OR gate 220 would then form a short pulse signal with a logic "1"; this is because the two signals on the lines "A" and "B" at the two counter overflow outputs A210 and A230 would always be (nearly) identical. The reset line "C" will immediately reset the counters 210,340 and therefore set the respective outputs to zero again.

If the clock frequencies of the divided-down clock signal F' (OUT) and the reference signal F(REF) now differ, then one of the two counting devices 210 and 240 will have a logic "1" at its counter overflow output at first; the respective other counting device would follow shortly afterwards. On account of this displacement between the two signals on the lines "A" and "B", the output A220 of the OR gate 220 would produce a pulsed signal on the line D whose pulse length dt is dependent on the magnitude of the error between the frequencies of the divided-down clock signal F' (OUT) and the reference signal F(REF).

The pulsed signal produced at the output A220 of the OR gate 220 on the line D is fed into the control counting device 400. If the pulsed signal on the line D has a logic "1", then the AND gate 410 is "switched through", so that the reference signal F(REF) can arrive at the counter 450 via the line E. The counter 450 then starts to count.

The incrementing of the counter 450 is controlled via the Reset input R450 of the counter 450, specifically via the inverter 420, the delay element 430 and the AND gate 440. This is because as soon as the pulsed signal on the line D changes from a logic "1"to a logic "0", the signal level at the output A420 of the inverter 420 changes from a logic "0" to a logic "1". On account of the delay time in the delay element 430, the edge change in the pulsed signal on the line D is not forwarded directly to the AND gate 440, which means that a logic "1"will be applied to the two inputs of the AND gate 440 for a certain length of time. As soon as this is the case, the AND gate 440 uses the line F and uses the Reset input R450 of the counter 450 to switch back the counter reading on the counter 450, which means that the counter 450 reaches its initial counter reading of "0"again. The counter 450 will now no longer be incremented further, since—as explained—the pulsed signal on the line D has been changed over from a logic "1" to a logic "0", whereupon the AND gate 410 disconnects the reference signal F(REF), and the latter can no longer reach the counter 450.

The inverter 420, the delay element 430 and also the AND gate 440 thus form a kind of edge detector which detects a falling edge of the pulsed signal on the line D and resets the counter 450 when the edge of the pulsed signal D is falling. The counter reading which can be reached by the counter 450 is thus dependent on how long the pulsed signal on the line D is at a logic "1" or how long the pulse length dt of the pulsed signal is on the line D. The longer the pulsed signal on the line D has a logic "1", the larger the counter reading on the counter 450 can become.

If the frequency of the divided-down clock signal F' (OUT) is now very significantly different from the clock frequency of the reference signal F(REF), then the pulse length of the pulsed signal on the line D will become very large, which means that the counter 450 can reach its maximum counter reading. If this happens, the counter overflow output A450 of the counter 450 produces a logic "1" which is sent via the line G to the flip-flop 600 and "turns on" the latter. After such "turning on", the output A600 of the flip-flop 600 produces a logic "1" which, as control signal, indicates that the frequency error between the frequency of the divided-down clock signal F' (OUT) from the oscillator 50 and the frequency of the reference signal F(REF) exceeds a prescribed error limit value.

The flip-flop 600 is reset by the Reset input R600 of the flip-flop 600, to which the inverter 470 and the AND gate 460 are connected via the line H. As soon as the frequency of the divided-down clock signal F' (OUT) and the frequency of the reference signal F(REF) are identical or differ only slightly, the pulse length dt of the pulsed signal D will be so short that the counter 450 will no longer reach its maximum counter reading and only a logic "0"may appear at the counter overflow output A450 of the counter 450 (line G). As soon as the counter overflow output A450 produces a logic "0", an edge change in the pulsed signal on the line D from a logic "1" to a logic "0" will result in a logic "1" appearing at the two inputs E460a and E460b of the AND gate 460, whereupon a logic "1" is produced at the output A460 of the AND gate 460 and thus on the line H and resets the flip-flop 600.

FIG. 3A shows the signal profiles on the lines A to H and also for the unlock signal for the situation in which the difference Δf between the frequency of the divided-down clock signal F' (OUT) and the frequency of the reference signal F(REF) is below a prescribed error limit value Δf(nominal). FIG. 3B shows the signal profiles on the lines C to H and also for the unlock signal for the situation in which the difference Δf between the frequency of the divided-down clock signal F' (OUT) and the frequency of the reference signal F(REF) exceeds a prescribed error limit value Δf(nominal).

FIG. 3A shows that the two signals on the lines A and B at the outputs of the two counting devices 210 and 220 change edge from a logic "0" to a logic "1" at slightly different times.

This time offset results in a pulsed signal on the line D whose pulse length dt corresponds to the interval of time between the edge change in the signal on the line A and the edge change in the signal on the line B, or is proportional thereto:

$$dt = |1/fref - 1/fvco| * 2^{n1}$$

where fvco indicates the frequency of the divided-down clock signal F' (OUT).

During the pulse length dt, the counter 450 is incremented with the signal F(REF). The time Δtg which the counter 450 requires in order to reach its maximum counter reading is obtained from:

$$\Delta tg = 1/fref * 2^{n2}$$

where n2 indicates the counter length of the counter 450, which can thus count up to $2^{n2}$. In other words, the counter 450 requires $2^{n2}$ clock cycles before it can trigger the RS flip-flop 600 via the line G and can produce the state "UNLOCK" at the output A600.

If the counter 450 reaches its maximum counter reading (dt>Δtg) during incrementing-that is to say during the pulse length dt of the pulsed signal on the line D —then the counter overflow output A450 of the counter 450 produces a logic "1" which is used to "turn on" the RS flip-flop 600 (FIG. 3B).

If, by contrast, the counter 450 does not reach its maximum counter reading (dt<Δtg) during incrementing—that is to say during the pulse length dt of the pulsed signal on the line D—because it is reset beforehand (FIG. 3A), then the flip-flop 600 is not "turned on".

As soon as the two signals on the lines A and B are at a logic "1", the AND gate 230 will produce a signal on the line C with a logic "1", said signal being used to reset the two counting devices 210 and 240. As soon as the pulsed signal on the line D has a falling edge, which is always the case after the pulse length dt has elapsed, the AND gate 440 produces a Reset signal on the line F, said signal being used to reset the counter 450.

The signal on the line F at the output of the AND gate 440 also has an influence on whether or not the flip-flop 600 is reset. If the counter reading on the counter 450 has reached its maximum counter reading during incrementing—that is to say during the pulse length dt of the pulsed signal on the line D—(FIG. 3B), then the counter overflow output A450 of the counter 450 produces a logic "1". In such a case, the inverter 470 together with the AND gate 460 blocks resetting of the flip-flop 600, so that an unlock signal set to a logic "1" will continue to be at a logic "1".

If, by contrast, the counter 450 does not reach its maximum counter reading during the time dt, then its counter overflow output A450 will produce a logic "0", whereupon the inverter 470 together with the AND gate 460 switches through the signal on the line F to the Reset input R600 of the flip-flop 600. This results in the unlock signal being set to a logic "0". The wave form for the signals C to H and also for the unlock signal is shown for this case in FIG. 3A.

By proportioning the counters (counting devices) 210 and 240 and also the counter 450, it is possible to define the difference frequency at which the UNLOCK is intended to be at a logic "1". In this case, the counter length n1 of the two counters 210 and 240 determines the length of the pulsed signal on the line D; the larger n1 is, the greater will be the length of the pulsed signal on the line D for a frequency error. The ratio of the counter lengths n1 to n2 determines that difference frequency from which the "UNLOCK" signal is intended to be produced.

The table below illustrates this circumstance by way of example:

| N1(Z1) | 16 | 16 | 16 | 16 |
|---|---|---|---|---|
| fref (MHz) | 300 | 300 | 300 | 300 |
| Δf (MHz) \| fref−fvco\| | 0.05 | 0.1 | 0.2 | 0.5 |
| Δt (line D and E) (ns) | 18 | 36 | 73 | 182 |
| N (pulses) on line E | 5 | 11 | 22 | 55 |
| n2 (Z2) | 3 | 4 | 5 | 6 |

In this case, Δf (MHz) |fref-fvco| denotes the frequency error between the divided-down clock signal F' (OUT) from the oscillator 50 and the reference signal F(REF). Depending on the frequency error, the respective length of the pulsed signal on the line D and the length of the time interval in which the pulses of the reference signal F(REF) are counted by the counter 450 are obtained. The number of pulses counted is indicated in the table in row "N (pulses) on line E". Row "n2 (Z2)" then indicates the counter length n2 of the counter 450 which is needed in order to produce the UNLOCK signal for the respective frequency difference.

The counters 210, 240 and/or 450 may be programmable counters in order to allow variable setting of the frequency difference.

In the exemplary embodiment described above, the counter 450 in the control counting device 400 has the flip-flop 600 connected downstream of it, which produces the UNLOCK signal when a logic "1" is applied to its SET input S600 on the line G. Since the signal on the line G already indicates that the frequency error Δf between the frequency fvco of the useful signal F' (OUT) and the frequency fref of the reference signal F(REF) exceeds the prescribed error limit value, it is also now possible to regard the output signal from the control counting device 400 on the line G as a control signal—that is to say as an UNLOCK signal—and to continue to use it as such. The flip-flop 600, which has a "storage function" in the exemplary embodiment above, may then be omitted.

10 Data regeneration circuit
20 Phase detector
30 Loop filter
40 Switch
50 Oscillator
60 Counter
70 Phase/frequency detector
80 Frequency comparison device
90 Loop filter
200 Pulse generation device
210 First counting device
220 OR gate
230 AND gate
240 Second counting device
400 Control counting device
410 AND gate
420 Inverter 430 Delay element
440 AND gate
450 Counter
460 AND gate
470 Inverter
600 Flip-flop
$U_{ref}$ Reference voltage
A,B,C,D,E,F,G,H Lines

I claim:

1. A frequency comparison device for producing a control signal which indicates that a frequency error between a first frequency of a useful signal and a second frequency of a reference signal exceeds a prescribed error limit value, the frequency comparison device comprising:
  a pulsed-signal generation device for using the useful signal and the reference signal to produce a pulsed signal having a pulse length that is proportional to a frequency difference between the first frequency of the useful signal and the second frequency of the reference signal, wherein the pulsed-signal generation device has at least two counting devices for producing the pulsed signal, and
  a pulse-length comparison device for comparing the pulse length with a predetermined maximum pulse length, and for one of producing the control signal and initiating production of the control signal if the pulse length exceeds the predetermined maximum pulse length,
  wherein the useful signal is present on a first counting device having a prescribed first maximum counter reading, the reference signal is present on a second counting device having a second maximum counter reading which matches the first maximum counter reading, the counter overflow outputs of the two counting devices are connected to a counter overflow monitoring device which monitors the two counting devices for a counter overflow and produces the pulsed signal if exclusively a single one of the two counting devices indicates a counter overflow.

2. The frequency comparison device according to claim 1, wherein the useful signal is one of an output signal from a controllable oscillator and an auxiliary signal formed using the output signal from the controllable oscillator.

3. The frequency comparison device according to claim 1, wherein the counter overflow monitoring device repeats the monitoring operation after the counter readings on the two counting devices have been reset.

4. The frequency comparison device according to claim 1, wherein the counter overflow monitoring device is connected to a control counting device which counts one of the pulses in the useful signal and the pulses in the reference signal while the pulsed signal is present.

5. The frequency comparison device according to claim 4, further comprising means for resetting a counter reading of the control counting device after the pulsed signal terminates.

6. The frequency comparison device according to claim 5, wherein a counter overflow output on the control counting device is connected to a Set input on a flip-flop.

7. A method for producing a control signal which indicates that the frequency error between a first frequency of a useful signal and a second frequency of a reference signal exceeds a prescribed error limit value, the method comprising:
  using the useful signal and the reference signal to produce a pulsed signal having a pulse length that is proportional to a frequency difference between the first frequency of the useful signal and second frequency of the reference signal, wherein producing the pulsed signal comprises using at least two counting devices, and wherein producing the pulsed signal further comprises feeding the useful signal into a first counting device having a prescribed first maximum counter reading, feeding the reference signal into a second counting device having a second maximum counter reading which matches the first maximum counter reading, respectively monitoring counter overflow outputs on the two counting devices for a counter overflow, and producing the pulsed signal during a period in which exclusively a single one of the first and second counting devices indicates a counter overflow,
  comparing the pulse length with a prescribed maximum pulse length, and
  producing the control signal if the pulse length exceeds the prescribed maximum pulse length.

8. The method according to claim 7, further comprising generating the useful signal using one of an output signal from a controllable oscillator and an auxiliary signal which is formed using the output signal from the controllable oscillator.

9. The method according to claim 7, further comprising repeating the monitoring operation after the counter readings on the two counting devices have been reset.

10. A method for producing a control signal which indicates that the frequency error between a first frequency of a useful signal and a second frequency of a reference signal exceeds a prescribed error limit value, the method comprising:
  using the useful signal and the reference signal to produce a pulsed signal having a pulse length that is proportional to a frequency difference between the first frequency of the useful signal and second frequency of the reference signal,
  comparing the pulse length with a prescribed maximum pulse length,
  producing the control signal if the pulse length exceeds the prescribed maximum pulse length, and
  feeding one of the useful signal and the reference signal into a control counting device while the pulsed signal is present, monitoring the counter reading on the control counting device, and producing the control signal if the counter reading on the control counting device reaches a prescribed limit counter reading.

11. The method according to claim 10, further comprising resetting the counter reading on the control counting device after the pulsed signal is terminated.

12. The method according to claim 11, wherein the prescribed limit counter reading corresponds to a maximum counter reading on the control counting device, and the method further comprises monitoring a counter overflow output on the control counting device, and producing the control signal if the counter overflow output of the control counting device indicates a counter overflow.

13. The method according to claim 12, further comprising producing the control signal using a flip-flop having a Set input that is connected to a counter overflow output of the control counting device.

14. A data regeneration circuit comprising a frequency comparison device for producing a control signal which indicates that a frequency error between a first frequency of a useful signal and a second frequency of a reference signal exceeds a prescribed error limit value, the frequency comparison device comprising:
  a pulsed-signal generation device for using the useful signal and the reference signal to produce a pulsed signal having a pulse length that is proportional to a frequency difference between the first frequency of the useful signal and the second frequency of the reference signal, wherein producing the pulsed signal comprises using at least two counting devices, and wherein producing the pulsed signal further comprises feeding the useful signal into a first counting device having a prescribed first maximum counter reading, feeding the reference signal into a second counting device having a second maximum counter reading which matches the first maximum counter reading, respectively monitoring counter overflow outputs on the two counting devices for a counter overflow, and producing the pulsed signal during a period in which exclusively a single one of the first and second counting devices indicates a counter overflow, and a pulse-length comparison device for comparing the pulse length with a predetermined maximum pulse length, and for one of producing the control signal and initiating production of the control signal if the pulse length exceeds the predetermined maximum pulse length.

15. A clock frequency control circuit for controlling a controllable oscillator such that the controllable oscillator generates a clock signal having a clock frequency that is within a predetermined frequency range, the clock frequency control circuit comprising:

a switch having a first input terminal coupled to receive a first control voltage, a second input terminal coupled to receive a second control voltage, wherein the switch is controlled by a switch control signal supplied to the control terminal to apply one of the first control voltage and the second control voltage to a control input terminal of the controllable oscillator, whereby the controllable oscillator generates the clock signal in response to one of the first and second control voltages in accordance with a switched state of said switch;

means for generating the second control voltage in response to an average of a first frequency of the clock signal and second frequency of a predetermined reference signal; and a frequency comparison device for generating the switch control signal, the frequency comparison device including:

a pulsed-signal generation device for generating a pulsed signal having a pulse length that is proportional to a frequency difference between a first frequency of the clock signal and a second frequency of the reference signal, and a pulse-length comparison device for comparing the pulse length of the pulsed signal with a predetermined maximum pulse length, and for generating the switch control signal when the pulse length exceeds the predetermined maximum pulse length; and means for generating the first control voltage by averaging a data signal having a third frequency with the clock signal generated by the controllable oscillator.

16. A clock frequency control circuit for controlling a controllable oscillator such that the controllable oscillator generates a clock signal having a clock frequency that is within a predetermined frequency range, the clock frequency control circuit comprising:

a switch having a first input terminal coupled to receive a first control voltage, a second input terminal coupled to receive a second control voltage, wherein the switch is controlled by a switch control signal supplied to the control terminal to apply one of the first control voltage and the second control voltage to a control input terminal of the controllable oscillator, whereby the controllable oscillator generates the clock signal in response to one of the first and second control voltages in accordance with a switched state of said switch;

means for generating the second control voltage in response to an average of a first frequency of the clock signal and second frequency of a predetermined reference signal; and a frequency comparison device for generating the switch control signal, the frequency comparison device including:

a pulsed-signal generation device for generating a pulsed signal having a pulse length that is proportional to a frequency difference between a first frequency of the clock signal and a second frequency of the reference signal, wherein the pulsed-signal generation device comprises a first counting device coupled to receive the clock signal and a second counting device coupled to receive the reference signal, and an overflow monitoring device for monitoring overflow signals generated by the first and second counting devices, and for producing the pulsed signal if exclusively one of the first and second counting devices generates a corresponding counter overflow signal, and a pulse-length comparison device for comparing the pulse length of the pulsed signal with a predetermined maximum pulse length, and for generating the switch control signal when the pulse length exceeds the predetermined maximum pulse length.

17. The clock frequency control circuit of claim 16, further comprising means for generating the first control voltage by averaging a data signal having a third frequency with the clock signal generated by the controllable oscillator.

18. The clock frequency control circuit of claim 16, further comprising means for resetting the first and second counting devices when both of the first and second counting devices generate overflow signals.

19. The clock frequency control circuit of claim 16, wherein the pulse-length comparison device comprises a control counting device for counting a number of pulses of one of the clock signal and the reference signal while the pulsed signal is generated by the pulsed-signal generation device, and for generating the switch controls signal when the counted number of pulses exceeds a maximum number of pulses associated with the predetermined maximum pulse length.

* * * * *